(12) United States Patent
Annayya et al.

(10) Patent No.: US 7,290,196 B1
(45) Date of Patent: Oct. 30, 2007

(54) CYCLICAL REDUNDANCY CHECK USING NULLIFIERS

(75) Inventors: Dinesh Annayya, Karnataka (IN); Vatan Kumar Verma, Madhya Pradesh (IN)

(73) Assignee: Cypress Semiconductor Corporation, San Jose, CA (US)

( * ) Notice: Subject to any disclaimer, the term of this patent is extended or adjusted under 35 U.S.C. 154(b) by 610 days.

(21) Appl. No.: 10/802,519

(22) Filed: Mar. 16, 2004

Related U.S. Application Data

(60) Provisional application No. 60/456,818, filed on Mar. 21, 2003.

(51) Int. Cl.
*H03M 13/00* (2006.01)

(52) U.S. Cl. .................... 714/758; 714/774

(58) Field of Classification Search ............. 714/781, 714/774, 758
See application file for complete search history.

(56) References Cited

U.S. PATENT DOCUMENTS

| | | | | |
|---|---|---|---|---|
| 5,237,593 | A * | 8/1993 | Fisher et al. | 375/367 |
| 5,598,424 | A * | 1/1997 | Erickson et al. | 714/799 |
| 5,724,368 | A * | 3/1998 | Zook | 381/71.1 |
| 6,141,784 | A * | 10/2000 | Davis et al. | 714/748 |
| 6,424,632 | B1 * | 7/2002 | Poret et al. | 370/395.3 |
| 6,519,737 | B1 | 2/2003 | Derby | |
| 6,519,738 | B1 | 2/2003 | Derby | |
| 6,754,870 | B2 * | 6/2004 | Yoshida et al. | 714/758 |
| 7,082,563 | B2 * | 7/2006 | Gemelli et al. | 714/758 |
| 2003/0093752 | A1 * | 5/2003 | Chen | 714/781 |
| 2004/0047327 | A1 * | 3/2004 | Chen | 370/342 |
| 2004/0137860 | A1 * | 7/2004 | Oh et al. | 455/127.1 |
| 2005/0042985 | A1 * | 2/2005 | Cheng et al. | 455/24 |
| 2005/0044057 | A1 * | 2/2005 | Bluvshteyn et al. | 707/1 |

OTHER PUBLICATIONS

Frenzel, Lois E., Programmable Framer Chip Improves OC-48 Efficiency, Apr. 16, 2001, Electroinc Design, pp. 1-4.*
Louis E. Frenzel, "Programmable Framer Chip Improves OC-48 Efficiency, Using virtual concatenation, a next-generation Sonet chip allocates bandwidth dynamically, facilitates provisioning, and preclassifies and tags packets to free up network processors.", Electronic Design Apr. 16, 2001, 4 pages.
Nilam Ruparelia, "Delivering Ethernet over Sonet using Virtual Concatenation", CommsDesign, Feb. 25, 2002, 8 pages.
Michael Timothy Moore, "Filling the WAN-communications-line card", www.ednmag.com, Apr. 18, 2002, p. 83-90.
"A Brief Explanation of CRC Computation", http://www.ece.msstate.edu/~reese/EE4743/crcexplained.htm, downloaded Jan. 16, 2004, 2 pages.
Eric E. Johnson, "High-Speed Computation on Cyclic Redundancy Checks", NMSU-ECE-95-011, Nov. 1995, 14 pages.

* cited by examiner

*Primary Examiner*—Guy Lamarre
*Assistant Examiner*—Mujtaba K. Chaudry
(74) *Attorney, Agent, or Firm*—Blakely Sokoloff Taylor & Zafman LLP

(57) ABSTRACT

An architecture and method for cyclical redundancy check (CRC) calculation and checking is disclosed. This architecture may include a CRC calculation function, a plurality of CRC nullification functions, and a multiplexer to select the output of one of the plurality of CRC nullification functions. The architecture may further comprise N-1 CRC nullification functions, where N is number bytes in the data bus.

22 Claims, 7 Drawing Sheets

| Bus Width | CRC Calculator # of XOR Gates | CRC Nullifier # of XOR Gates |
|---|---|---|
| 128 | 2496 | 512 |
| 64 | 1376 | 576 |
| 56 | 1280 | 544 |
| 48 | 1056 | 448 |
| 40 | 928 | 512 |
| 32 | 800 | 384 |

| Bus Width | Architecture of Fig. 1B # of XOR Gates | Architecture of Fig. 4 # of XOR Gates |
|---|---|---|
| 128 | 22,819 | 9,784 |
| 64 | 6,830 | 3,996 |
| 32 | 2,128 | 1,586 |

CYCLICAL REDUNDANCY CHECK USING NULLIFIERS

REFERENCE TO RELATED APPLICATION

This application claims the benefit of U.S. Provisional Application No. 60/456,818, filed Mar. 21, 2003.

TECHNICAL FIELD

Embodiments of the invention relate to the field of data communications protocols, and to the error checking of data transported using these protocols.

BACKGROUND

FIG. 1A illustrates a conventional architecture of a line card, used in a network communication device that includes a link layer device and a framer. The link layer device typically includes components such as a network processor, a network co-processor, memory, data path switching element (DSE), network search engine (NSE), and a clock management block. The network processor and/or a framer usually performs packet processing functions. Packet processing functions may involve tasks such as packet pre-classification or classification, protocol conversion, quality of service assurance, service policing, provisioning, and subscriber management functions. The framer is used to transport data such as ATM (asynchronous-transfer-mode) cells, IP packets, and newer protocols, such as GFP (generic framing procedure) over SONET (synchronous optical network)/SDH (synchronous packet processing system hierarchy) links. On the port side, the framer may support optical-networking protocols for both SONET/SDH and direct data-over-fiber networks. The framer is coupled to the physical layer port such as a SONET device, which is coupled to a network medium such as optics. On the system side, the framer interfaces to the link-layer device usually through standard buses, for example, the Universal Test and Operation Physical interface device for ATM (UTOPIA) or Packet Over SONET-physical layer (POS-PHY) buses.

A packet processing function may also involve tasks such as error detection, and the cyclical redundancy check (CRC) algorithm is commonly used to implement this in communication systems. The CRC algorithm is among the strongest checksum algorithms available for detecting and correcting errors in communications packets. In a high-speed design as the system operating speed increases it is common design practice to expand the internal bus width. An exemplary 10 G (10 gigabits per second) system may have a 128-bit wide bus.

A conventional architecture for implementing the CRC protocol is shown in FIG. 1B. This architecture comprises N number of CRC calculators to process an N-byte wide bus. FIG. 1B shows an exemplary N byte wide input bus coupled to a plurality of byte-wide calculators comprising a first byte calculator, second byte calculator and so on up to an Nth byte calculator. The input data from the input bus is passed to all the CRC byte calculators in parallel. The output of the CRC calculators is passed to a multiplexer, and the output of the multiplexer (a CRC output taken from the selected CRC calculator) is chosen based on the byte-enable at the end of packet (EOP).

A disadvantage of this conventional implementation is that the number of fast and pipelined CRC calculators required equals the number of bytes in the bus-width. Fast and pipelined CRC calculators typically require significant die area and consume a significant amount of power during their operation. In this conventional implementation, as the input bus-width increases the area and power required by the implementation increases rapidly.

BRIEF DESCRIPTION OF THE DRAWINGS

Embodiments of the invention may best be understood by referring to the following description and accompanying drawings that are used to illustrate embodiments of the invention in which.

DETAILED DESCRIPTION

In the following description, numerous specific details are set forth to provide a thorough understanding of the invention. However, it is understood that the invention may be practiced without these specific details. In other instances, well-known circuits, structures and techniques have not been shown in detail in order not to obscure the invention. A "line" as discussed herein that connects components may represent a single bit line, multiple bit lines, or buses. The phrase "coupled to" as used herein means connected directly to, or indirectly to through one or more intervening components. It should be noted that a "physical interface device" is also referred to as a "physical-layer device."

An apparatus and method are described for a CRC computation operation using a nullification function. In one embodiment, the apparatus may include a cycle redundancy check (CRC) calculator, one or more CRC nullifiers. In one embodiment, the CRC calculator may perform a closed loop function and the one or more CRC nullifiers may perform an operation outside of the closed loop function.

The CRC computation operation has certain useful characteristics. A first characteristic is that as the bus width increases, the increase in the total logic required to perform the exclusive-or (XOR) operation of the CRC computation is mainly due to data terms. A second characteristic is that in a byte-enabled circuit, the byte validation operation is only required at the end of packet (EOP).

Figure 2:
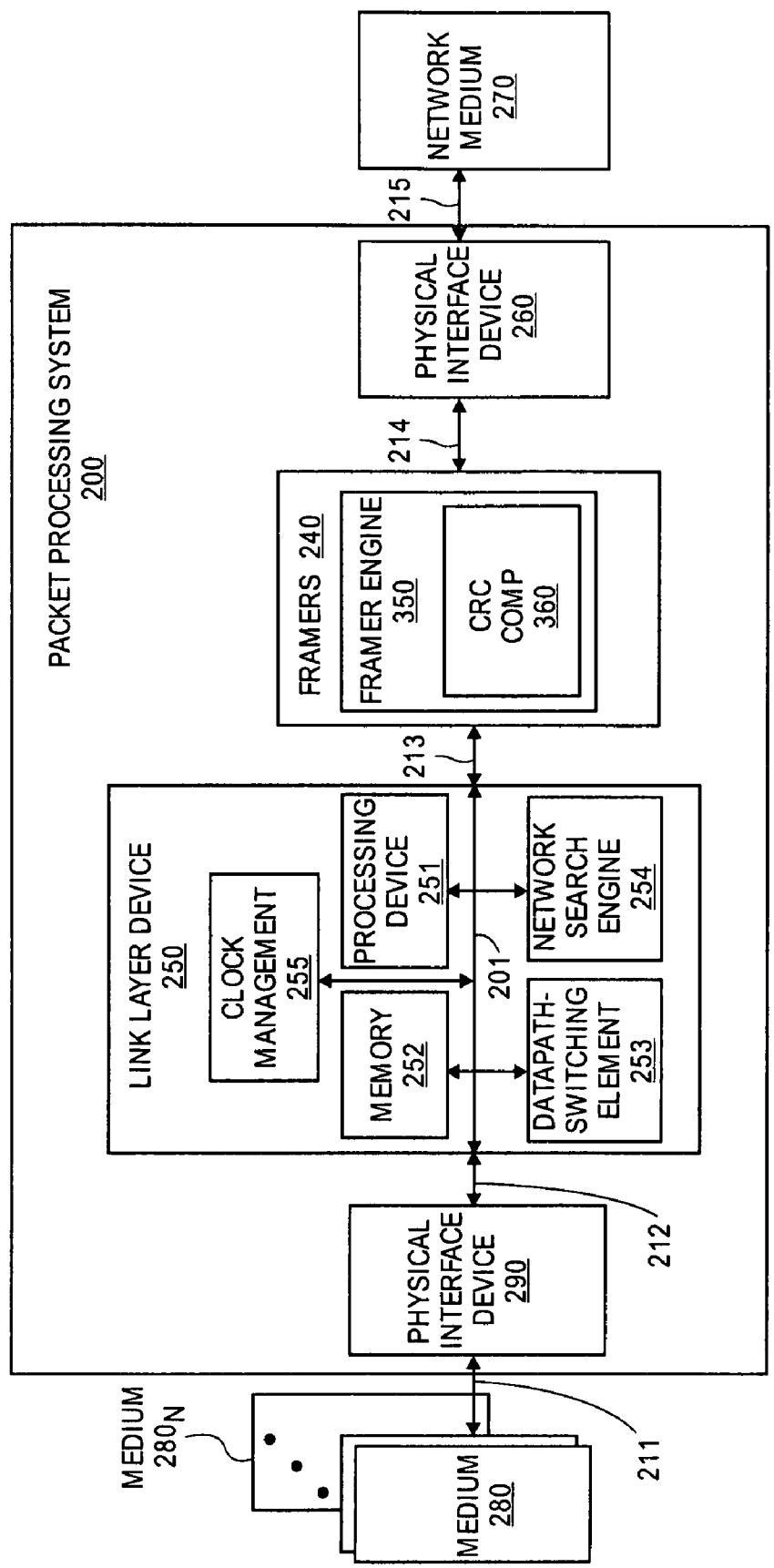
FIG. 2 illustrates one embodiment of a packet processing system having CRC computation circuitry with a nullification function.

FIG. 2 illustrates one embodiment of a packet processing system having CRC computation circuitry with a nullification function. Packet processing system 200 may be used in a communication system such as a computer, server, router, switch, server load balancer, add/drop multiplexer, digital cross connects, or other piece of communication equipment. In one embodiment, the packet processing system 200 may be implemented in a line card that links external network connections to each other. Some examples of line cards include a switch-fabric card, a time-division multiplexed data card, an Ethernet data card and an optical carrier (OC) data card. The communication system that hosts the line card may have, for example, a chassis and a backplane with many slots into which one or more line cards may be mounted. The line cards can be removed and inserted to change the number of ports or to support different communications protocols or physical interface devices. Alternatively, packet processing system 200 may be implemented in other cards or integrated into other system components.

Packet processing system 200 may be coupled to network medium 270 by line 215, and to one or more mediums $280_1$-$280_M$ by line 211. Medium $280_1$-$280_M$ may be similar or dissimilar mediums. In one embodiment, for example, medium 270 may be optics and medium $280_1$ may be copper and medium $280_M$ may be optics. Alternatively, other similar and dissimilar configurations of mediums and network mediums may be used. In one embodiment, M may represent the number of communication ports that are coupled to the packet processing system 200. In one embodiment, packet processing system 200 may include physical interface device 290, link layer device 250, framer 240 which includes CRC computation circuitry 360, and physical interface device 260. The link layer device 250 is coupled to the physical interface device 290 and framer 240. In an alternative embodiment, framer 240 may include multiple framer engines and multiple CRC computation circuitry. In an alternative embodiment, packet processing system 200 may include multiple physical interface devices 290. In one embodiment, the packet processing system 200 may be used as one communication channel from medium 280 to network medium 270. In an alternative embodiment, the packet processing system 200 may be implemented in multiple communication channels from multiple mediums to multiple network mediums. In one embodiment, the mediums and the network mediums may be copper. In alternative embodiments, similar and dissimilar mediums and network mediums may be used.

Link layer device 250 may include a processing device 251, memory 252, data path switching element (DSE) 253, network search engine (NSE) 254, and/or a clock management block 255. The components of the link layer device 250 may be coupled to each other using one or more buses and/or lines as exemplified by bus 201. In one embodiment, for example, the components of link layer device 250 may be arranged and coupled in a look-aside configuration. In the look-aside configuration the processing device 251 of link layer device 250 may include a network processor and a network co-processor. In the look-aside configuration, the network co-processor resides beside the network processor outside the data path (bus 201), enabling packet co-processing in parallel with the network processor operation, increasing the overall throughput. In another embodiment, the components of link layer device 250 may be arranged and coupled in a streaming configuration. In the streaming configuration, the data path includes both the network processor and the network co-processor. Packets pass though the network co-processor, so it can act on packets as required and pass them directly to the network processor. Alternatively, the components of link layer device 250 may be arranged and coupled in other configurations known in the art.

In one embodiment, the processing device 251 may be a network processor. A network processor is a specialized microprocessor that supports the address sizes and common operations of networking equipment, and may perform some or all the packet processing functions. Typical network processors allow multiple processors to share the computational load of a high-speed data stream. The network processor may be used for processing information and/or controlling the movement of data packets to and from framer 240. In another embodiment, the processing device 251 may be a field programmable gate array (FPGA). Alternatively, the processing device 251 of link layer device 250 may represent one or more other processing devices such as a general-purpose processor (e.g., a Motorola PowerPC™ processor or an Intel® Pentium® processor), a special purpose processor (e.g., a digital signal processor (DSP)), and a controller. In an alternative embodiment, the processing device 251 of the link layer device 250 may not be used, and the processing functions may be performed in the framer 240.

The DSE 253 of link layer device 250 may be used to multiplex the data transmitted on bus 201. The NSE 254 of link layer device 250 may perform data route-table look-ups. In one embodiment, NSE 254 may be, for example, a content addressable memory (CAM) device. In an alternative embodiment, the operations of the NSE 254 may be performed by other devices, for example, a random access memory (RAM) with a hashing function performed in the processing device 251. The NSE 254 may also serve as a server-load balancer, which takes incoming traffic from the Internet and distributes the processing load among a number of servers. Memory 252 of link layer device 250 may included a random access memory (RAM), or other dynamic storage devices, for storing information (e.g., packets) and instructions to be executed by processing device 251 of link layer device 250. The memory 252 of link layer device 250 may be used for storing temporary variables or other intermediate information during execution of instructions by processing device 251. The memory 252 of link layer device 250 may also include a read only memory (ROM) and/or other static storage device for storing static information and instructions for processing device 251 of link layer device 250. It should be noted that link layer device 250 may also include other components that have not been illustrated. It should be noted that the components of link layer device 250 have been shown with separate components. In an alternative embodiment, one or more of the components of link layer device 250 may be combined with other components into one or more integrated circuits. In one embodiment, the framer 240 may be coupled to the physical interface device 260. In an alternative embodiment, framer 240 may reside external to packet processing system 200. Framer 240 may include network protocol related circuitry to encode and decode the data that is transmitted on network medium 270 for error detection and correction purposes, a packet encapsulator that operates to map arbitrary data streams to a regular data stream, a framer engine, and a CRC computation circuitry 360 as discussed in detail below.

Depending upon the particular design environment implementation, framer 240 may be coupled to a physical interface device 260. Physical interface device 260 may be, for example, a SONET device, an Ethernet card, a token ring card, or other types of physical interface devices for providing a communication link to network medium 270 to and from the framer 240. SONET devices and Ethernet cards are known in the art; accordingly, a detailed discussion is not provided. In one embodiment, the physical interface device 260 may be similar or dissimilar interfaces devices. In an alternative embodiment, framers 240 may reside external to packet processing system 200.

It will be appreciated that the packet processing system 200 represents only one example of a packet processing system, which may have many different configurations and architectures. For example, some packet processing systems often have multiple buses, such as a peripheral bus, a dedicated cache bus, etc. As another example, packet processing system 200 may be a line card. In one embodiment, the line card may be used in a system-to-network interface. Alternatively, the line card may be implemented in an intermediate node in a network that provides a network-to-network interface, such as a wide area network (WAN). Such an intermediate node may provide an interface between similar networks or dissimilar networks.

In one exemplary embodiment, packet processing system 200 may be a line card in a WAN connecting a data stream from Ethernet to SONET. In this embodiment, the line card is coupled to an optic network medium (network medium 270) and a copper medium (medium 280) by lines 215 and 211, respectively. The copper medium may include multiple serial ports. The copper medium is coupled to an Ethernet device (physical interface device 290) of the line card by line 211. The Ethernet device acts as a serializer/deserializer (SERDES) and may be a backbone link between multiple line cards. The Ethernet device is coupled to the link layer device 250 by line 212. In such an exemplary embodiment, the link layer device 250 may utilize a FPGA device as processing device 251. In this exemplary embodiment, packet processing functions, such as encapsulating the data into a communication protocol, such as ATM, GFP, and HDLC, that may be performed in processing device 251, are performed by the framer 240. The framer 240, acting as master device, receives isolated input data packets and frames the data to be output as back-to-back framed data to the SONET device (physical interface device 260) on line 214 (described in detail below). The SONET device transmits the framed data over the optic medium (network medium 270) on line 215. In another embodiment, multiple packet processing systems may be implemented in multiple line cards, each line card including a framer and a SONET device coupled to a network medium, and the line cards may be coupled to each other through a backbone physical interface. In an alternative embodiment, the operations discussed below in the context of framer 240 may be performed in other devices, such as, for example, a network processor, co-processor, encapsulator, or switch.

Figure 3:
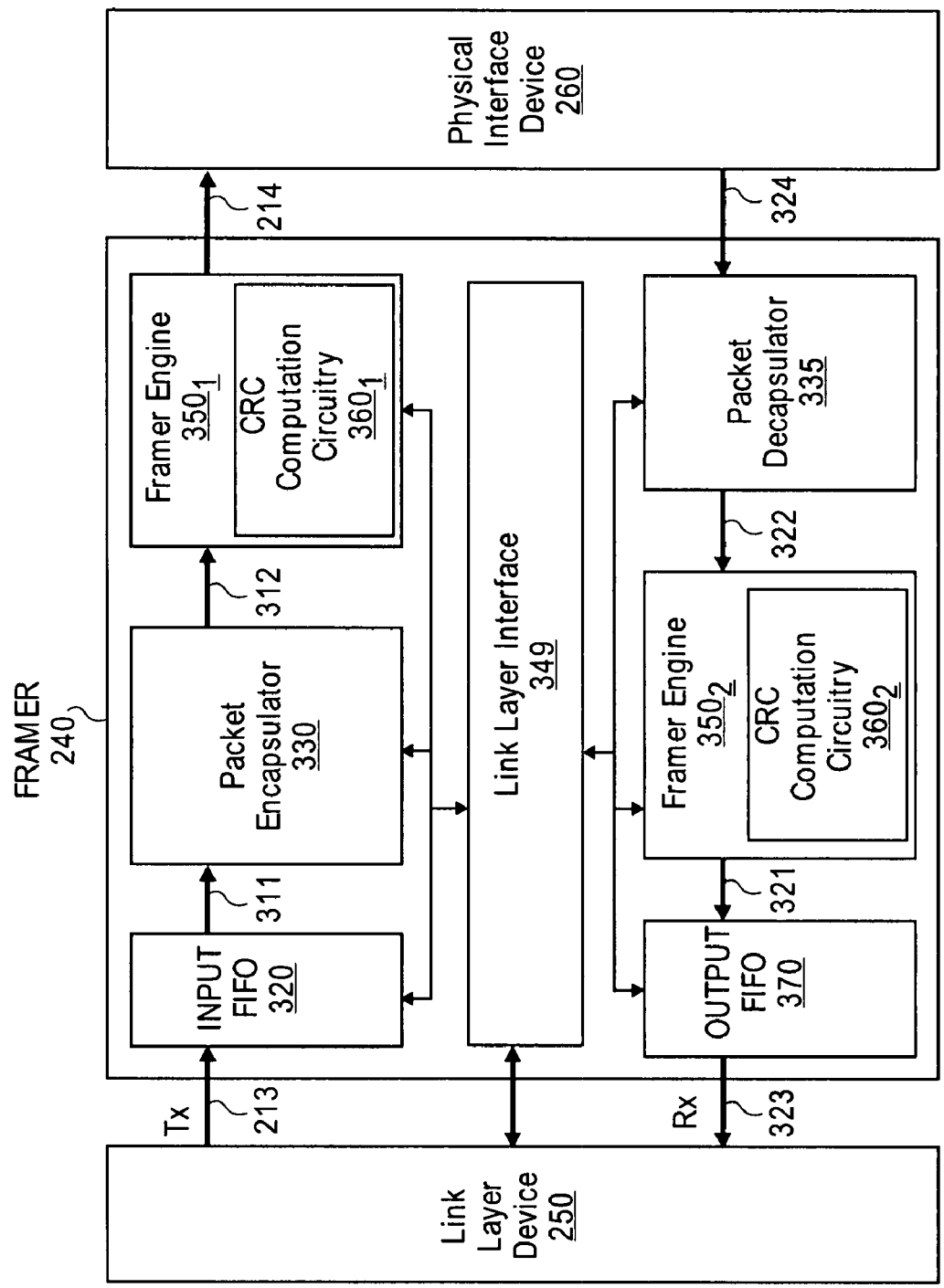
FIG. 3 illustrates one embodiment of framer having a framer engine that includes CRC computation circuitry.

FIG. 3 illustrates one embodiment of a framer 240 including CRC computation circuitry. Framer 240 formats data into a packet protocol structure that may be conducive to transmission and receipt on physical interface device 260. The packet protocol specifies the arrangement of data within the packet. The data may be transmitted along a transmission (Tx) data path from a link layer device 250 to a framer 240 on line 213, and from the framer 240 to a physical interface device 260 on line 214. Data may also be received along receive (Rx) data path from physical interface device 260 to framer 240 on line 324 and from framer 240 to link layer device 250 on line 323. The data paths may be structural portions of the framer 240, which under the influence of control through link layer interface 349, manipulates and passes data between link layer device 250 and physical interface device 260.

In the transmission data path, framer 240 may include an input first-in-first-out (FIFO) 320, a packet encapsulator 330 and a framer engine $350_1$. Packet encapsulator 330 is coupled to an input FIFO 320 framer engine $350_1$ by lines 311 and 312, respectively. Packet encapsulator 330 of framer 240 performs data modifications to the packet and encapsulates the data into a communication protocol. Framer engine $350_1$ is coupled to the physical interface device 260 by line 214. Data arriving on line 214 faster than the throughput capacity of framer 240 may result in a dropped transmission. Input FIFO 320 operates to buffer the input data stream received from link layer device 250 in order to handle overloads of packets in the input data stream. The physical interface device 260 may output to a network medium 270. Network medium 270 may be copper or optics or other network mediums known in the art. In alternative embodiments, buffering may be accomplished by other means, for example, using a RAM or a FIFO coupled to framer 240 or memory 252 of link layer device 250.

Packet encapsulator operates to map arbitrary data streams to a regular data stream that are output to framer engine $350_1$ on line 312. Framer engine $350_1$ operates to align the input data stream packets into frames to be transmitted to the physical interface device 260 on line 214. Framer engine $350_1$ frames the packets according to a framing specification. The framing specification may be a specification of the "protocol bits" that surround the "data bits" to allow the data to be "framed" into segments. The framing specification allows a receiver to synchronize at points along the output data stream. Framer engine $350_1$ includes CRC computation circuitry $360_1$ to generate a packet error checking code. The packet error checking code may be, for example, appended at the end of a packet (or other locations in the packet) to provide error detection functionality to determine whether a received packet is good or whether errors are present in the data stream. Using packet error checking, CRC computation circuitry in a receiving packet processing system (e.g., similar to CRC computation circuitry $360_2$ in the Rx path) can detect transmission errors by recalculating a check code from the data packet and comparing it to a check value originally transmitted. It should be noted that the CRC computation circuitry $360_1$ need not be located in the framer engine $350_1$ and may be disposed at any place along the Tx data path.

In the receive data path, framer 240 may include a packet decapsulator 335 and a framer engine $350_2$. Packet decapsulator 335 is coupled to framer engine $350_2$ by line 322. Packet decapsulator 335 removes the framing data from packets. When framing data is removed from a packet, the data therein may become irregular. Framer engine $350_2$ operates to align data in the packets to achieve a continuous data stream. Framer engine $350_2$ is coupled to output FIFO 370 by line 321. Output FIFO 370 is coupled to physical interface device 260 by line 323. Output FIFO 370 operates to buffer the data stream output to link layer device 250. It should be noted that framer engine 350 and/or framer 240 may include other components known in the art that are not shown so as not to obscure an understanding of embodiments of the invention. For example, additional FIFOs may be present that operate to buffer the output data stream transmitted to/from physical interface device 260 on lines 214 and 324, respectively. It should be noted that the framer 240 has been shown with block components only for ease of illustration and discussion. One or more of the block components of framer 240 may be combined with other components into one or more integrated circuits.

Framer engine $350_2$ also CRC computation circuitry $360_2$ for performing packet error checking. CRC computation circuitry $360_2$ operates to verify the accuracy of the data stream by generating a code using the received data and comparing the generated code with a received code embedded in the data stream to determine whether a packet is good or errors are present. In one embodiment, the data stream checked at this receiving end by framer engine $350_2$ uses essentially similarly processes to those used to generate the code for transmission by framer engine $350_1$. As such, although illustrated separately, framer engines $350_1$ and $350_2$ may be a single framer engine with CRC computation circuitry. The CRC computation circuitry 360 discussed below in relation to FIGS. 4 and 7 may be used to perform the operations of CRC computation circuitry $360_1$ and $360_2$ of FIG. 3.

Figure 4:
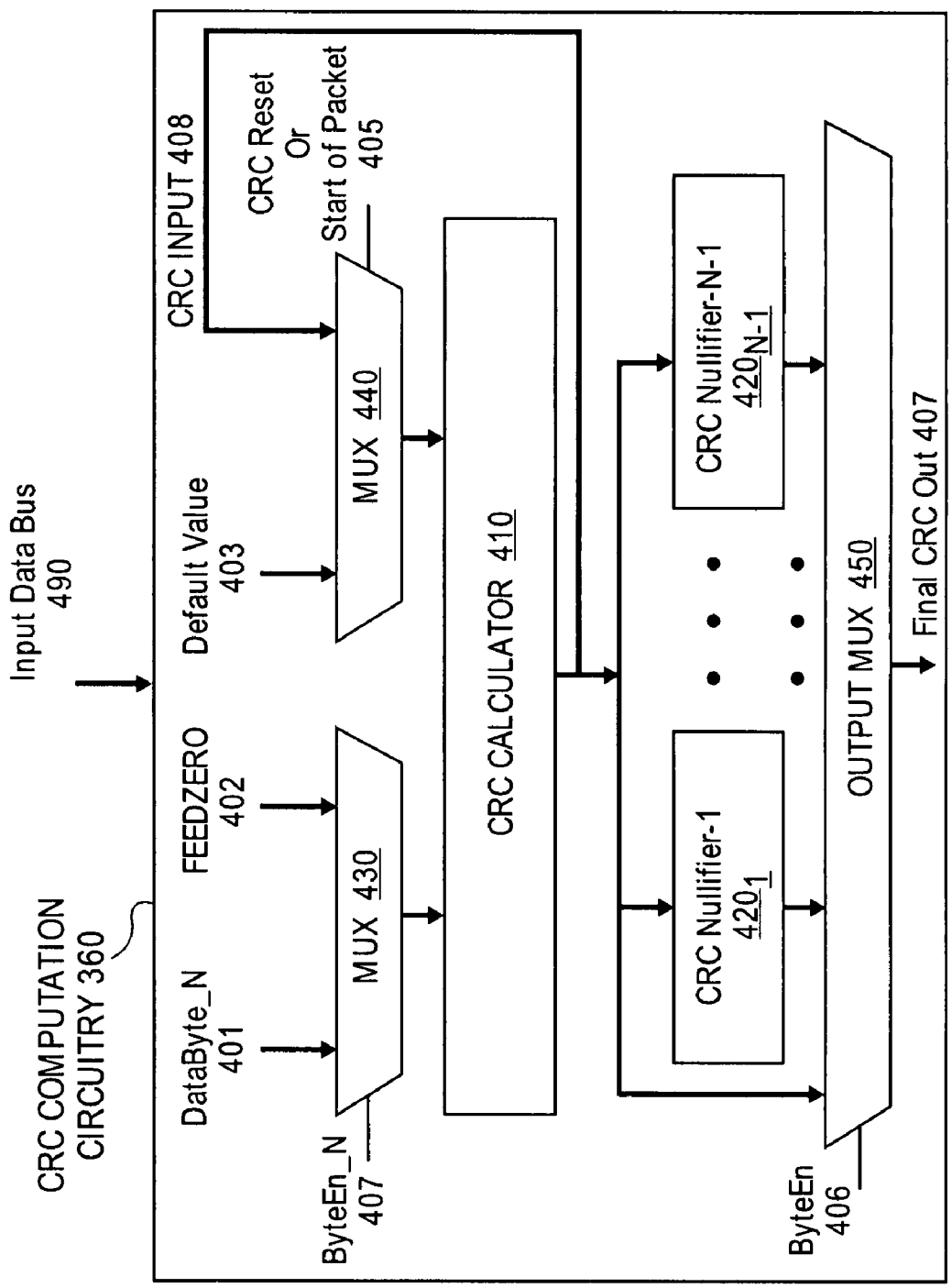
FIG. 4 illustrates one embodiment of CRC computation circuitry having CRC calculators and nullifiers.

FIG. 4 illustrates one embodiment of CRC computation circuitry having CRC calculators and nullifiers. In this embodiment, CRC computation circuitry 360 includes a single CRC calculator 410, a plurality of CRC nullifiers $420_1$ to $420_{N-1}$ and multiplexers (MUX) 430, 440 and 450. The inputs to the multiplexer 430 include a data byte (DataByte_N) input signal 401 and a feed zero input signal 402. The output of multiplexer 430 is controlled by a byte enable (ByteEn_N) signal 407. The inputs to the multiplexer 440 include a default value input signal 403, and a CRC input signal 408 that is coupled to receive the output of the CRC calculator 410. The output of the multiplexer 440 is controlled by the CRC reset or start of packet signal 405. The outputs of multiplexers 430 and 440 are coupled to the CRC calculator 410. In one embodiment, the output of the CRC calculator 410 is coupled to the output multiplexer 450 and to the CRC nullifiers $420_1$ to $420_{N-1}$, where N is the width of the input data bus 490, in bytes. The outputs of the CRC nullifiers are coupled to output multiplexer 450. The output multiplexer 450 is controlled by a byte enable signal 406. The output from multiplexer 450 is the final CRC out value. The operation of the CRC computation circuitry 360 is discussed below in relation to FIG. 7. Multiplexers, CRC calculators and nullifiers are known in the art. Accordingly, a more detailed description is not provided.

Figures 5, 6A, 6B:
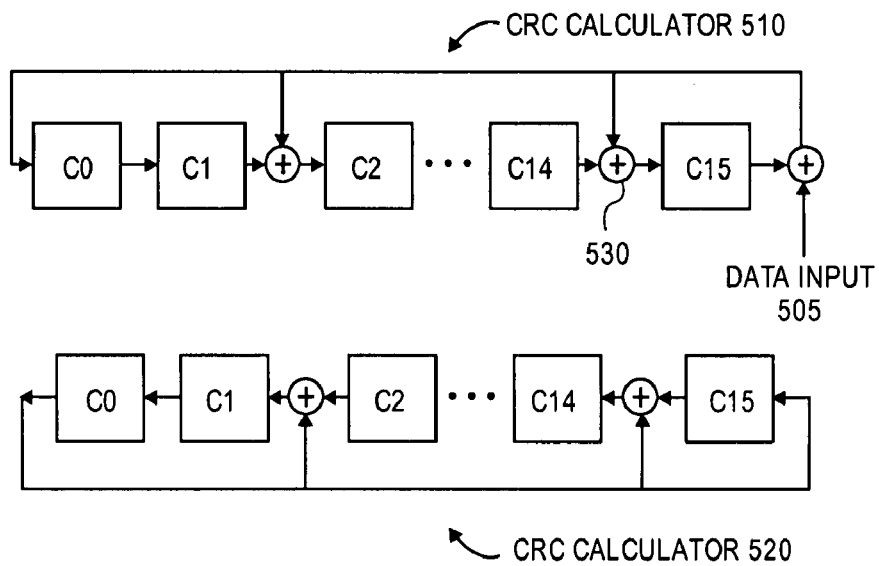
FIG. 5 illustrates an exemplary implementation embodiment of the CRC calculator and nullifiers of the CRC computation circuitry of FIG. 4.
FIG. 6A is a table illustrating XOR requirements of exemplary implementations using CRC computation circuitry of FIG. 4.
FIG. 6B is a table illustrating the XOR requirements of a conventional architecture of CRC calculation versus an exemplary embodiment of CRC calculator and nullifier functions of CRC computation circuitry of FIG. 4.

FIG. 5 illustrates an exemplary embodiment of the operations of 1-bit CRC calculator and nullifier using shift registers for an exemplary polynomial $1+x^2+x^15+x^16$. In this exemplary embodiment, CRC calculator 410 includes flip-flops C0-C15. The "+" represents an XOR operation (e.g., XOR operation block 530). Data is input (Data input 505) to the linear feedback shift registers (LFSR) serially from the most significant bit (MSB) of the LFSR and the output of the flip-flops gives the computed value of the CRC calculator 410.

The CRC calculator 510 operates on the assumption that the entire data field is valid if the current transfer to CRC calculator 510 does not contain an EOP character for the packet. However, when not all the data bytes are valid (possible only when current transfer contains the EOP), the CRC calculator 510 is fed with zeros in place of invalid data bits. As the invalid data field is fed with zeros, the changes occurring in the new value of CRC are only a function of the CRC terms. If the data input 505 is zero, then changes that occur in the CRC value will be only a function of the CRC terms, and not of the data terms. From this, the actual value of the CRC can be obtained by performing a reverse XOR operation (as referred to as a 'back tracing' technique) on each of the CRC bits. As the byte validation operation is required only at the EOP, the CRC nullifier operation can be performed in a separate clock cycle. The operation of the CRC nullifier 520 is not a part of CRC calculator's closed loop function, so this operation can be performed in a following cycle or cycles without affecting the performance of the CRC calculator 510. When the CRC nullifier's 520 operation takes place on the previous packet CRC value, the CRC calculator 510 can compute the CRC value of the current transfer of current packet.

The CRC nullifier 520 is a 1-bit nullifier for the same polynomial as the CRC calculator 510. As such, the nullifier is derived based on the CRC polynomial. The changes that occur in the CRC value due to feeding of extra 0's will not be a function of the data input (which is 0) because the output of an XOR function does not depend on the inputs having logic value 0. The actual value of the CRC (which has been changed because of the feedings of 0's) can be achieved by reverse XOR operations. As shown in FIG. 5, there is no data input for the CRC nullifier 520 and the direction of shift operation is opposite to that in CRC calculator 510. The parallel CRC nullifier for n-bits can be derived form the serial LFSR by looking ahead at the output of a flip-flop after n number of shifts.

It should be noted that the length of the shift registers and the number of XOR operations depends on the selected polynomial. It should also be noted that the embodiment illustrated in FIG. 5 is only exemplary and that any fast CRC calculator may be used for CRC calculator 410 of FIG. 4.

FIG. 6A is a table illustrating a comparison of the number of 2-input X-OR gates required to implement one CRC calculator and one CRC nullifier for different data-input bus-widths. This table uses the polynomial $x^0+x^1+x^2+x^4+x^5+x^7+x^8+x^10+x^11+x^12+x^16+x^22+x^23+x^26+x^32$. For a 128 bit bus width, for example, one CRC calculator may have 2,496 XOR gates while one CRC nullifier may have 512 XOR gates. Because an CRC nullifier requires a fewer number of XOR gates, CRC calculation that is implement with the multiple nullifier architecture of FIG. 4 will require a lesser number of XOR gates than CRC calculation implemented with the multiple CRC calculator architecture of FIG. 1B.

FIG. 6B is a table illustrating exemplary XOR requirements of a conventional architecture of CRC calculation utilizing multiple CRC calculators versus CRC computation using a single CRC calculator and multiple CRC nullifiers. The architecture of FIG. 4 utilizes one n-byte CRC calculator and n-1 byte to 1 byte CRC nullifiers. So, for example, the total number of XOR operations required for 128 bit bus using the architecture of FIG. 4 equals the XOR operations required by the 128 bit CRC calculator+the XOR operations required by a 120-bit nullifier+the XOR operations required by a 104-bit nullifier+the XOR operations required by a 96-bit nullifier+the XOR operations required by a 88-bit nullifier+the XOR operations required by a 80-bit nullifier+the XOR operations required by a 72-bit nullifier+the XOR operations required by a 64-bit nullifier+the XOR operations required by a 56-bit nullifier+the XOR operations required by a 48-bit nullifier+the XOR operations required by a 40-bit nullifier+the XOR operations required by a 32-bit nullifier+the XOR operations required by a 24-bit nullifier+the XOR operations required by a 16-bit nullifier+the XOR operations required by an 8-bit nullifier.

Figure 1A:
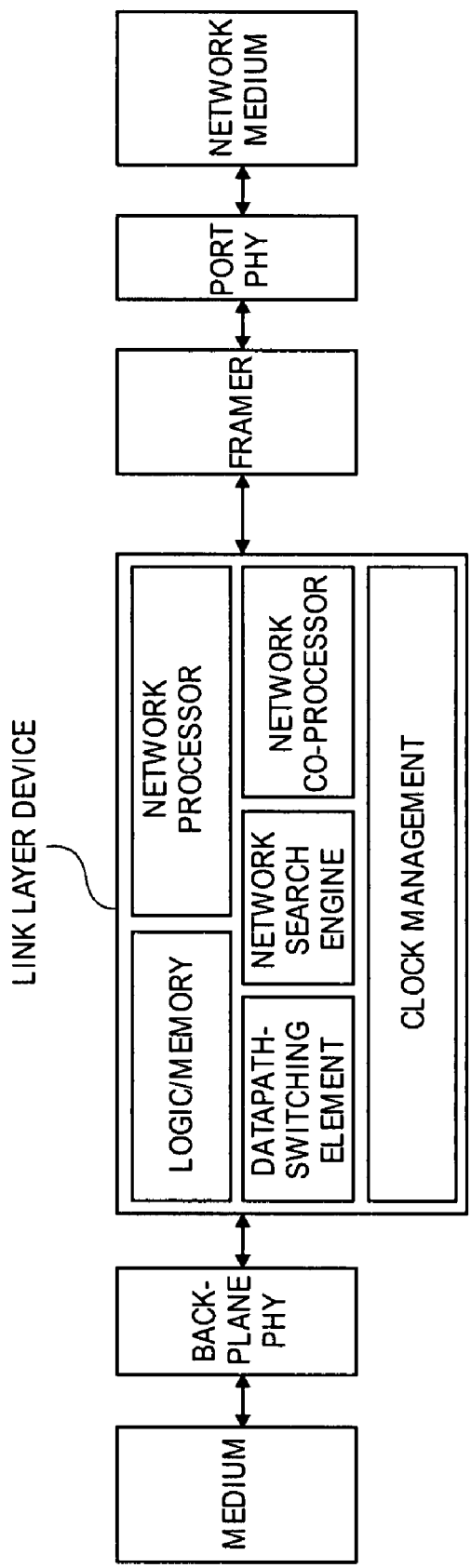
FIG. 1A illustrates a conventional architecture of a line card, used in a network communication device, that includes a link layer device and a framer
Figure 1B:
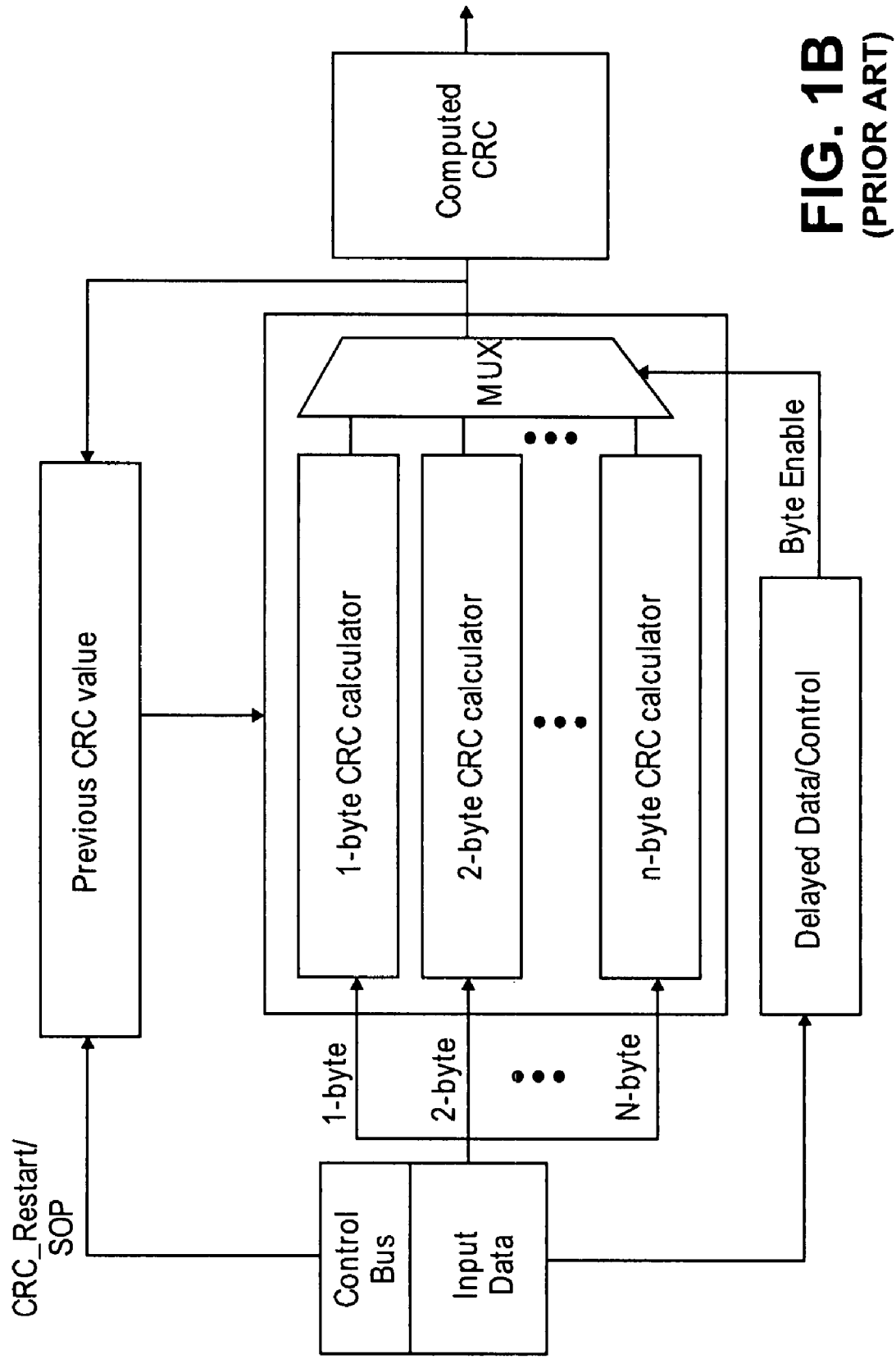
FIG. 1B illustrates a conventional architecture for CRC calculation.

In contrast, the total number of XOR operations required for the same 128 bit bus width using the architecture of FIG. 1B equals the XOR operations require by the 128 bit CRC calculator+the XOR operations require by the 120 bit CRC calculator+the XOR operations require by the 112 bit CRC calculator+the XOR operations require by the 104 bit CRC calculator+the XOR operations require by the 96 bit CRC calculator+the XOR operations require by the 88 bit CRC calculator+the XOR operations require by the 80 bit CRC calculator+the XOR operations require by the 72 bit CRC calculator+the XOR operations require by the 64 bit CRC calculator+the XOR operations require by the 56 bit CRC calculator+the XOR operations require by the 48 bit CRC calculator+the XOR operations require by the 40 bit CRC calculator+the XOR operations require by the 32 bit CRC calculator+the XOR operations require by the 24 bit CRC calculator+the XOR operations require by the 16 bit CRC calculator+the XOR operations require by the 8 bit CRC calculator.

Figure 7:
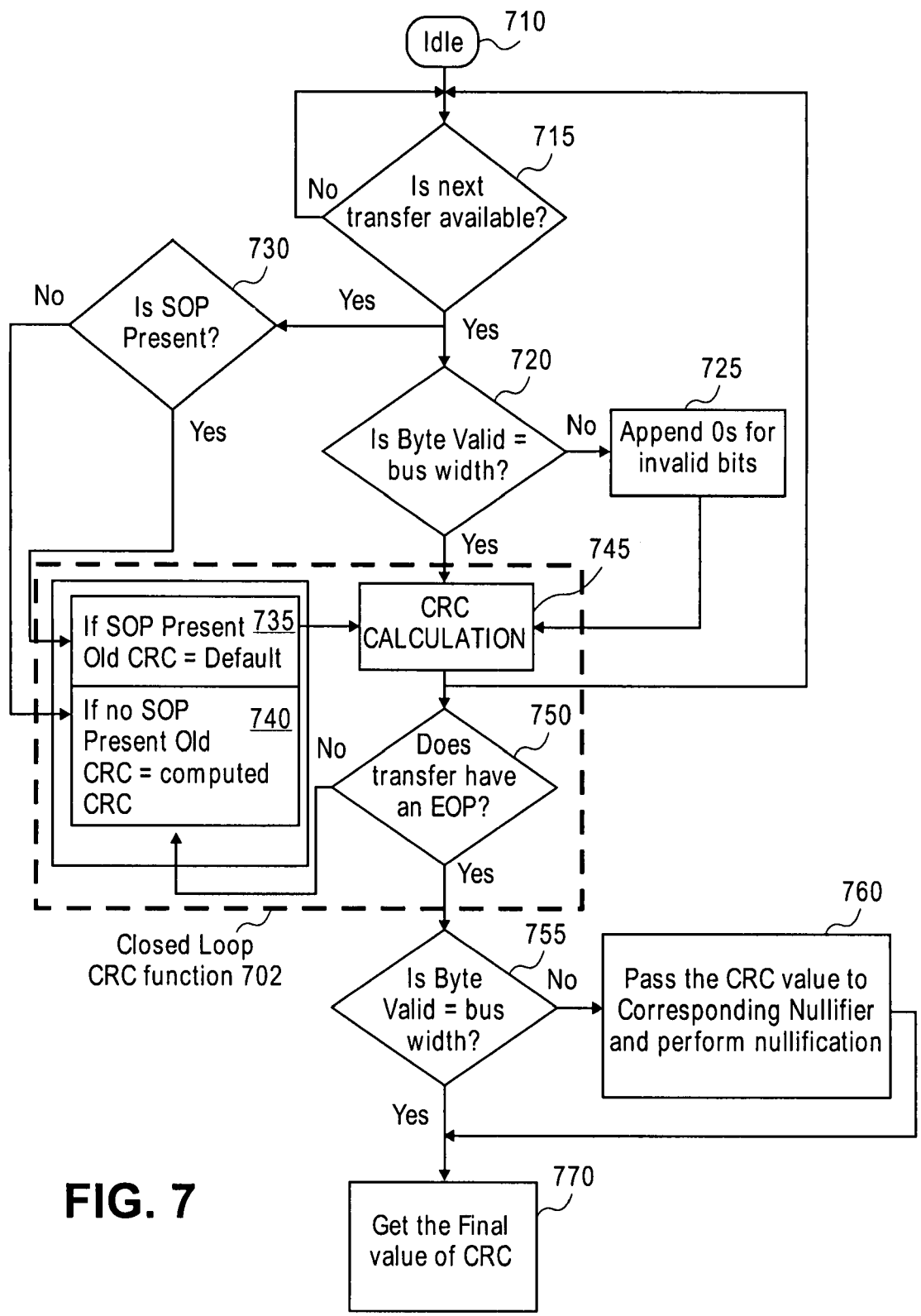
FIG. 7 is a flow chart illustrates one embodiment of a method of cycle redundancy checking using a nullification function.

As can been seen in the table of FIG. 6B, for a 128 bit bus, the architecture of FIG. 4 requires 9,784 XOR gates versus the much greater 22,819 number of XOR gates for the architecture of FIG. 1B. The improved architecture significantly reduces the both the area and power required, and timing related challenges associated with CRC computation logic in high-speed data communication systems FIG. 7 is a flow chart illustrates one embodiment of a method of cycle redundancy checking using a nullification function. In this embodiment, starting from an Idle state 710, a check is performed to see if the next transfer is available, step 715. In step 720 a check is performed to determine of the byte valid value is equal to the bus width. If not, then multiplexer 430 (of FIG. 4) selects Feed Zero input 402 to feed zeros to CRC calculator 410 which appends zeros to the invalid data field, step 725. In parallel, in one embodiment, a check is performed to determine if a Start Of Packet (SOP) character is present, step 730.

A closed loop calculation function 702 may then be performed, and a nullification function 760 may be performed outside of the closed loop calculation function 702. In the closed loop calculation function 702, if a SOP character is present, signal 405 selects default value 403 to be output from multiplexer 440 and provided to CRC calculator 410. CRC calculator 410 assigns the default value to the 'OLD CRC' value, step 735. Otherwise, the computed CRC value is applied to the 'OLD CRC' value, step 740 and fed into the CRC calculation of the step 745. In this step 745, the CRC calculator 410 computes the CRC over the full data bus width using a fast, pipelined CRC calculation function. CRC calculator functions are known in the art; accordingly a detailed description is not provided.

In step 750, if the current transfer to the CRC calculator 410 does not contain the EOP, the calculated CRC value will be fed back as the OLD CRC value (on CRC input 408 of FIG. 4) to the CRC calculator 410, step 740. If it does contain the EOP, the method proceeds to step 755. In this step 755, a check is performed to determine if the byte valid value is equal to the bus width. If so, then the output of the CRC calculator 410 is selected by output multiplexer 450, under the control of ByteEn 406, to obtain the final CRC out value 407 of FIG. 4, step 770. If not, the calculated CRC value will go through a corresponding CRC nullifier (one of CRC nullifiers $420_1$ to $420_{N-1}$) that performs a nullification function, step 760, to get the actual value of the CRC (final CRC out value 407) depending on the byte valid information for step 770.

An advantage of embodiments of the methods and apparatus discussed herein over the conventional architecture of FIG. 1B is that the conventional architecture requires N-CRC calculators to handle an N-byte wide bus, while embodiments of the methods and apparatus of the invention may utilize a single calculator to support an N-byte wide bus. Such an improved architecture is advantageous because it requires significantly less area to implement and consumes less power than the conventional architecture of FIG. 1B.

Although the methods and apparatus of the invention have been described at times in relation to hardware components, the methods and apparatus may also be implemented by software or a combination of hardware and software. Portions of the present invention may be provided as in the form of a machine-readable medium having stored thereon instructions, which may be used to program a computer system (or other electronic devices) to perform a process according to the present invention. A machine readable medium includes any mechanism for storing or transmitting information in a form (e.g., software, processing application) readable by a machine (e.g., a computer). The machine-readable medium may includes, but is not limited to, magnetic storage medium (e.g., floppy diskette); optical storage medium (e.g., CD-ROM); magneto-optical storage medium; read only memory (ROM); random access memory (RAM); erasable programmable memory (e.g., EPROM and EEPROM); flash memory; electrical, optical, acoustical or other form of propagated signal (e.g., carrier waves, infrared signals, digital signals, etc.); or other type of medium suitable for storing electronic instructions.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention. In addition, while the invention has been described in terms of several embodiments, those skilled in the art will recognize that the invention is not limited to the embodiments described. The embodiments of the invention can be practiced with modification and alteration within the scope of the appended claims. The description is thus to be regarded as illustrative instead of limiting on the invention.

What is claimed is:

1. An apparatus, comprising:
a cycle redundancy check (CRC) calculator; and
a CRC nullifier coupled to the CRC calculator, wherein the CRC calculator and the CRC nullifier are configured to determine a CRC value over an input data stream whose width is less than the width of an input data bus of the CRC calculator, and wherein the CRC value is determined by a reverse exclusive-or (XOR) operation on each of the bits received from the CRC calculator using the CRC nullifier when the current transfer contains an End of Packet (EOP) character.

2. The apparatus of claim 1, wherein the CRC nullifier is one of a plurality of CRC nullifiers, each having an output, wherein the apparatus further comprises an output multiplexer coupled to the plurality of CRC nullifiers to select the output of one of the plurality of CRC nullifiers, and wherein the CRC calculator is configured to receive a zero in place of each invalid bit of the input data stream when the width of the input data stream is less than the width of the input data bus of the CRC calculator.

3. The apparatus of claim 2, further comprising a data bus having N bytes coupled to the CRC calculator, wherein the plurality of CRC nullifiers comprise N-1 CRC nullifiers.

4. The apparatus of claim 2, further comprising:
a first input multiplexer coupled to the CRC calculator; and
a second input multiplexer coupled to the CRC calculator.

5. The apparatus of claim 4, wherein the first input multiplexer is coupled to receive a data byte input signal and a feed zero input signal.

6. The apparatus of claim 5, wherein the second input multiplexer is coupled to receive a default value input signal and a CRC input signal.

7. The apparatus of claim 6, wherein the first input multiplexer and the CRC calculator are each coupled to receive a byte enable signal.

8. The apparatus of claim 2, wherein the CRC calculator performs a closed loop function and wherein the plurality of CRC nullifiers perform an operation outside of the closed loop function.

9. The apparatus of claim 1, wherein the CRC calculator and the CRC nullifier reside in a framer and wherein the apparatus further comprises:
a link layer device coupled to the framer; and
a physical interface coupled to the framer.

10. The apparatus of claim 9, wherein the physical interface is coupled to a first optical network and the link layer device is coupled to at least one of a second optical network and a copper network.

11. A method, comprising:
receiving data on an input data bus having a N byte width, where N is greater than one;
passing the data from the input data bus to a cycle redundancy check (CRC) computation circuitry having a CRC calculator and at least one nullifier;
computing a CRC value over the input data bus width using the CRC calculator;
determining if the current transfer contains an End of Packet (EOP) character;
feeding the calculated CRC value back as an old CRC value to the CRC calculator if the current transfer does not contain the EOP character; and
feeding the calculated CRC value to the at least one nullifier if the current transfer does contain the EOP character.

12. The method of claim 11, further comprising receiving the EOP character in the data and performing a byte validation operation only when the EOP character is received.

13. The method of claim 11, further comprising:
performing a closed loop calculation function using the CRC calculator; and
performing a nullification function outside of the closed loop calculation function using the at least one nullifier of a plurality of nullifiers.

14. The method of claim 13, wherein closed loop calculation function is performed in a first cycle and wherein the nullification function is performed in one or more cycles following the first cycle.

15. The method of claim 13, further comprising performing an available transfer check and determining if a Start Of Packet character is available, before the performing of the closed loop calculation function.

16. The method of claim 15, further comprising:
determining if a byte valid value is equal to the input data bus width; and
appending zeros to an invalid data field if the byte valid is not equal to the input data bus width.

17. The method of claim 16, wherein performing the closed loop calculation function comprises:
computing the CRC value over the input data bus width using the CRC calculator;
determining if the current transfer contains the EOP character;
feeding the calculated CRC value back as the old CRC value to the CRC calculator if the current transfer does not contain the EOP character; and
feeding the calculated CRC value to the at least one nullifier of the plurality of nullifiers if the current transfer does contain the EOP character.

18. The method of claim 17, wherein nullification function is performed if the current transfer contains the EOP character and if the byte valid value is not equal to the input data bus width.

19. The method of claim 18, wherein performing the nullification function comprises:
determining if the byte valid value is equal to the input data bus width and,
if so, obtaining an actual CRC value based on the byte valid value, and
if not, passing the CRC value through a corresponding one of the plurality of nullifiers to get the actual CRC value based on the byte valid value.

20. An apparatus, comprising:
means for performing a closed loop calculation function using cycle redundancy check (CRC) calculator;
means for determining if a current transfer contains an End of Packet (EOP) character; and
means for performing a nullification function outside of the closed loop calculation function using a nullifier when the current transfer contains the EOP character.

21. The apparatus of claim 20, further comprising means for performing an available transfer check and determining if a Start Of Packet character is available.

22. The apparatus of claim 21, further comprising:
means for determining if a byte valid value is equal to the input data bus width; and
means for appending zeros to an invalid data field if the byte valid is not equal to the input data bus width.

* * * * *